US012749725B2

(12) United States Patent
Oury

(10) Patent No.: US 12,749,725 B2
(45) Date of Patent: Sep. 29, 2026

(54) BATTERY MODULE WITH INTEGRATED PRESSURE MEASUREMENT

(71) Applicant: GM GLOBAL TECHNOLOGY OPERATIONS LLC, Detroit, MI (US)

(72) Inventor: Andrew P. Oury, Troy, MI (US)

(73) Assignee: GM Global Technology Operations LLC, Detroit, MI (US)

(*) Notice: Subject to any disclaimer, the term of this patent is extended or adjusted under 35 U.S.C. 154(b) by 636 days.

(21) Appl. No.: 18/155,421

(22) Filed: Jan. 17, 2023

(65) Prior Publication Data

US 2024/0243374 A1 Jul. 18, 2024

(51) Int. Cl.

*H01M 10/48* (2006.01)
*G01L 1/04* (2006.01)
*G01R 31/392* (2019.01)
*H01M 10/04* (2006.01)
*H05K 1/189* (2026.01)

(52) U.S. Cl.

CPC ............... *H01M 10/48* (2013.01); *G01L 1/04* (2013.01); *G01R 31/392* (2019.01); *H01M 10/0468* (2013.01); *H05K 1/189* (2013.01); *H01M 2220/20* (2013.01)

(58) Field of Classification Search

CPC .... H01M 10/48; H01M 10/482; H01M 10/46; H01M 10/0468; H01M 10/0445; H01M 10/045; H01M 2220/20; G01R 31/392; G01L 1/04; H05K 1/189

See application file for complete search history.

(56) References Cited

U.S. PATENT DOCUMENTS

2021/0288386 A1* 9/2021 Hofer ...................... B60L 50/64
2023/0017033 A1* 1/2023 Fronemann ......... H01M 50/503
2023/0344027 A1* 10/2023 Kang ................ H01M 10/4207

* cited by examiner

*Primary Examiner* — Raymond Alejandro
(74) *Attorney, Agent, or Firm* — Quinn IP Law

(57) ABSTRACT

A battery module with integrated pressure measurement. The battery module may include a plurality of battery cells configured for storing and supplying electrical power, a housing module including a base configured for supporting the battery cells and a plurality of walls configured for providing a restraining pressure on the battery cells, an assembly including a central cover covering the battery cells, a strain gauge circuit configured for sensing a deformation of the central cover resulting from the central cover expanding and contracting with the battery cells, and a cell monitoring unit (CMU) configured for generating a pressure measurement based on the deformation.

20 Claims, 4 Drawing Sheets

BATTERY MODULE WITH INTEGRATED PRESSURE MEASUREMENT

The present disclosure relates to battery modules having pressure measurement capabilities, such as but not necessarily limited to battery modules having a pressure measurement system configured for measuring pressure resulting from battery cells expanding and contracting while storing and supplying electrical power.

A battery module may be configured for storing and supplying electrical power in support of various electrical operations, such as but not necessarily limited to storing and supplying electrical power in support of an electric vehicle. When included as part of an electric vehicle, the battery module may include a plurality of battery cells configured for storing and supplying the electrical power, with the ability of the battery cells to store and supply the electrical power being influenced by operation of the electric vehicle. The electric vehicle may include a wide variety of systems and subsystems where the operation thereof may be controlled or predicated based at least in part on a state of health (SOH), a state of charge (SOC), or other electrical capability of the battery cells to store and supply electrical power.

Some battery modules may be configured to sense, measure, calculate, or otherwise assess resistance, current, voltage, and temperature for purposes of determining the SOH, SOC, or other electrical capability of the battery cells. Such battery modules, however, may lack a capability to measure a pressure resulting from battery cells expanding and contracting while storing and supplying electrical power. The pressure resulting from the battery cells expanding and contracting may influence the electrical capabilities of the battery cells such that it may be desirable to consider the pressure when determining the SOH, SOC, or making other judgements as to the electrical capabilities of the battery cells.

SUMMARY

One non-limiting aspect of the present disclosure relates to a battery module having pressure measurement capabilities. The battery module may include a pressure measurement system configured for measuring a pressure resulting from battery cells or other power device expanding and contracting while storing and supplying electrical power. The pressure measurement system may include a strain gauge circuit or other device configured to measure deformation of the battery module and a cell monitoring unit (CMU) or other computation module configured for generating a pressure measurement based on the amount of the deformation. The pressure measurement may be considered when determining SOH, SOC, or other electrical capabilities of the battery cells.

One non-limiting aspect of the present disclosure relates to battery module with integrated pressure measurement. The battery module may include: a plurality of battery cells stacked in a side-by-side facing relation and configured for storing and supplying electrical power, with the battery cells periodically expanding and contracting sideways when storing and supplying the electrical power; a housing module including a base configured for supporting the battery cells and opposed sidewalls configured for restraining the battery cells in the side-by-side facing relation and with the opposed sidewalls configured for providing a sideways pressure on the battery cells; an integrated interconnect board (ICB) assembly configured for electrically interconnecting the battery cells with the ICB assembly including a central cover extending end-to-end between opposed ends of the battery cells and with the central cover configured for expanding and contracting sideways with the battery cells; a strain gauge circuit configured for measuring a sideways deformation of the central cover resulting from the central cover expanding and contracting sideways with the battery cells; and a cell monitoring unit (CMU) configured for generating a pressure measurement of the sideways pressure based on the sideways deformation.

The strain gauge circuit may be configured for integrating with a flexible printed circuit board (PCB) mounted to the central cover.

The flexible PCB may include one or more sensing devices configured for sensing current, voltage, and/or temperature of the battery cells.

The housing module may include opposed endwalls configured for restraining the opposed ends of the battery cells. The CB assembly may include opposed endwall plates extending from the central cover, the opposed endwall plates having busbars configured for electrically interconnecting the battery cells. The CMU may be configured for mounting between one of the endwall plates and one of the opposed endwalls.

The flexible PCB may include a plurality of electrical traces extending end-to-end across the central cover for electrically connecting the sensing devices to the battery cells.

The flexible PCB may be mounted to an outboard side of the central cover.

The central cover may be comprised of an electrically isolating material and an inboard side of the central cover faces the battery cells.

The CMU may be configured to calculate a state of charge (SOC) and/or a state of health (SOH) of the battery cells based at least in part on the pressure measurement.

The strain gauge circuit may include a stressed strain gauge and an unstressed strain gauge, optionally with the stressed strain gauge configured for moving in response the sideway deformation and the unstressed strain gauge configured for remaining stationary in response to the sideway deformation.

The battery cells may be configured for supplying electrical power to an electric motor configured to drive an electric vehicle and/or for storing electrical power received from an onboard battery charging module (OBCM) of the electric vehicle.

The strain gauge circuit may include a filter configured to filter out noise resulting from vibration of the vehicle.

The central cover may include opposite sidewall flanges configured for extending from the central cover between the battery cells and the opposed sidewalls, optionally with the sidewall flanges compressing against the battery cells with the sideways pressure.

One non-limiting aspect of the present disclosure relates to a battery module with integrated pressure measurement. The battery module may include a plurality of battery cells configured for storing and supplying electrical power, with the battery cells periodically expanding and contracting when storing and supplying the electrical power; a housing module including a base configured for supporting the battery cells and a plurality of walls configured for providing a restraining pressure on the battery cells; an integrated interconnect board (ICB) assembly configured for electrically interconnecting the battery cells, with the ICB assembly including a central cover covering the battery cells and the central cover configured for expanding and contracting with the battery cells; a strain gauge circuit configured for sensing a deformation of the central cover resulting from the central cover expanding and contracting with the battery cells; and a cell monitoring unit (CMU) configured for generating a pressure measurement of the restraining pressure based on the deformation.

The strain gauge circuit may be configured to sense the deformation from side-to-side across the central cover.

The strain gauge circuit may be configured to sense the deformation from end-to-end across the central cover.

The strain gauge circuit may be configured to sense the deformation from end-to-end and side-to-side across the central cover.

The strain gauge circuit may be configured for integrating with a flexible printed circuit board (PCB) mounted to the central cover.

The battery cells may be stacked side-to-side.

The housing module may include opposed sidewalls and opposed endwalls configured for restraining the battery cells.

The ICB assembly may include opposed sidewall flanges and opposed endwall flanges extending toward the battery cells relative to the central cover, with the ICB assembly including opposed endwall plates extending from the opposed endwall flanges and the opposed endwall plates having busbars configured for electrically interconnecting the battery cells.

The CMU may be configured for mounting between one of the endwall plates and one of the opposed endwalls.

The battery cells may be configured for storing and supplying electrical power for an electric vehicle.

The strain gauge circuit may include a filter configured to filter out noise resulting from vibration of the electric vehicle.

The flexible PCB may include one or more sensing devices configured for sensing current, voltage, and/or temperature of the battery cells and a plurality of electrical traces extending end-to-end between the opposed endwall flanges for electrically connecting the sensing devices to the battery cells.

One non-limiting aspect of the present disclosure relates to a pressure measurement system for a battery module, the battery module including a plurality of battery cells configured for storing and supplying electrical power to a traction motor of a vehicle. The pressure measurement system may include a housing module including a base configured for supporting the battery cells and a plurality of walls configured for providing a restraining pressure on the battery cells; a strain gauge circuit configured for sensing a deformation of the housing module resulting from the battery cells expanding and contracting; and a cell monitoring unit (CMU) configured for generating a pressure measurement of the restraining pressure based on the deformation.

The strain gauge circuit may include a filter configured to filter out noise resulting from vibration of the vehicle and is integrated with a flexible printed circuit board (PCB) mounted to a central cover of the housing module.

These features and advantages, along with other features and advantages of the present teachings, are readily apparent from the following detailed description of the modes for carrying out the present teachings when taken in connection with the accompanying drawings. It should be understood that even though the following figures and embodiments may be separately described, single features thereof may be combined to additional embodiments.

BRIEF DESCRIPTION OF THE DRAWINGS

The accompanying drawings, which are incorporated into and constitute a part of this specification, illustrate implementations of the disclosure and together with the description, serve to explain the principles of the disclosure.

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
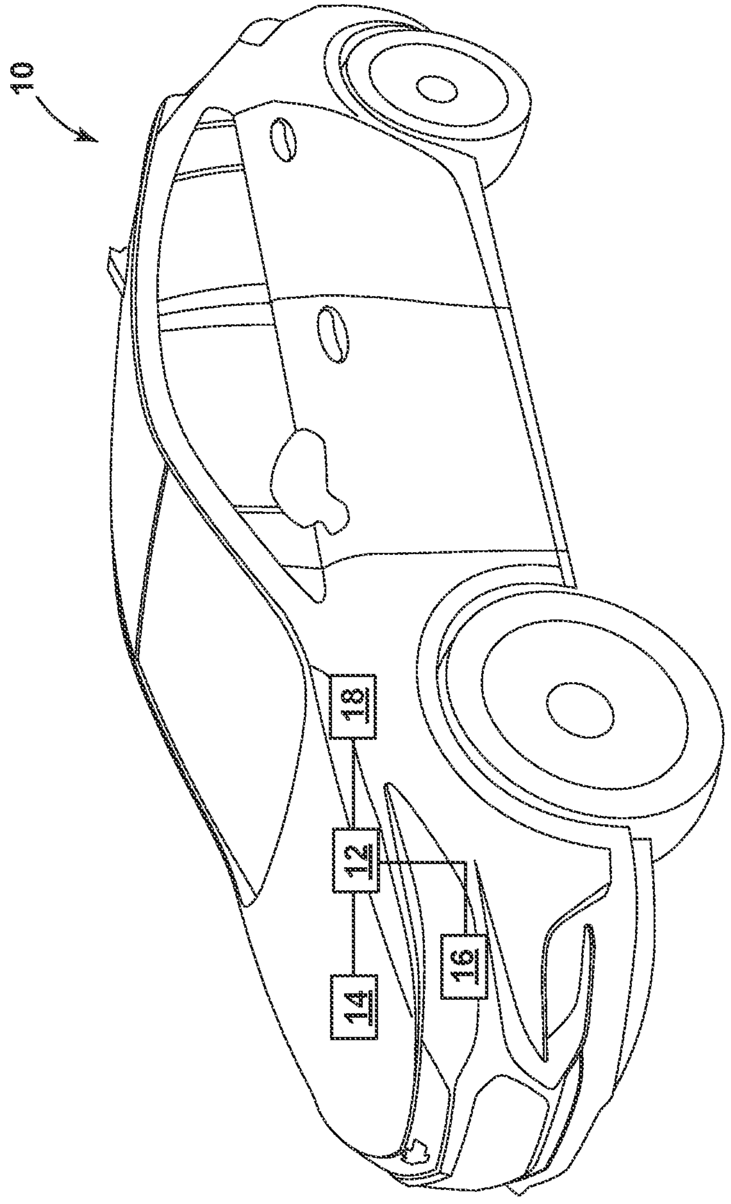
FIG. 1 illustrates a schematic diagram of a vehicle having a battery module in accordance with one non-limiting aspect of the present disclosure.

FIG. 1 illustrates a schematic diagram of a vehicle 10 having a battery module 12 in accordance with one non-limiting aspect of the present disclosure. The battery module 12 may be configured for storing and supplying electrical power in support of various operations of the vehicle 10. The battery module 12 may be operable with an electric motor 14, an onboard battery charging module (OBCM) 16, and/or other systems 18 of the vehicle 10. The vehicle 10 may be an electric vehicle, another type of vehicle, or another type of devices, such as a machine, a robot, etc. In the case of the illustrated vehicle 10, the battery module 12 may be configured for exchanging electrical power with the traction motor 14 for purposes of providing mechanical power to a drivetrain (not shown) or other device operable for driving the vehicle 10 and with the OBCM 16 for purposes of exchanging electrical power with additional devices connected thereto, such as to facilitate charging or discharging events with a charging station, another vehicle, a power grid, etc. The battery module 12 is described with respect to its use within the vehicle 10 for exemplary and non-limiting purposes as the present disclosure fully contemplates the battery module 12 being similarly beneficial in storing and supplying electrical power for other devices and/or for other purposes.

Figure 2:
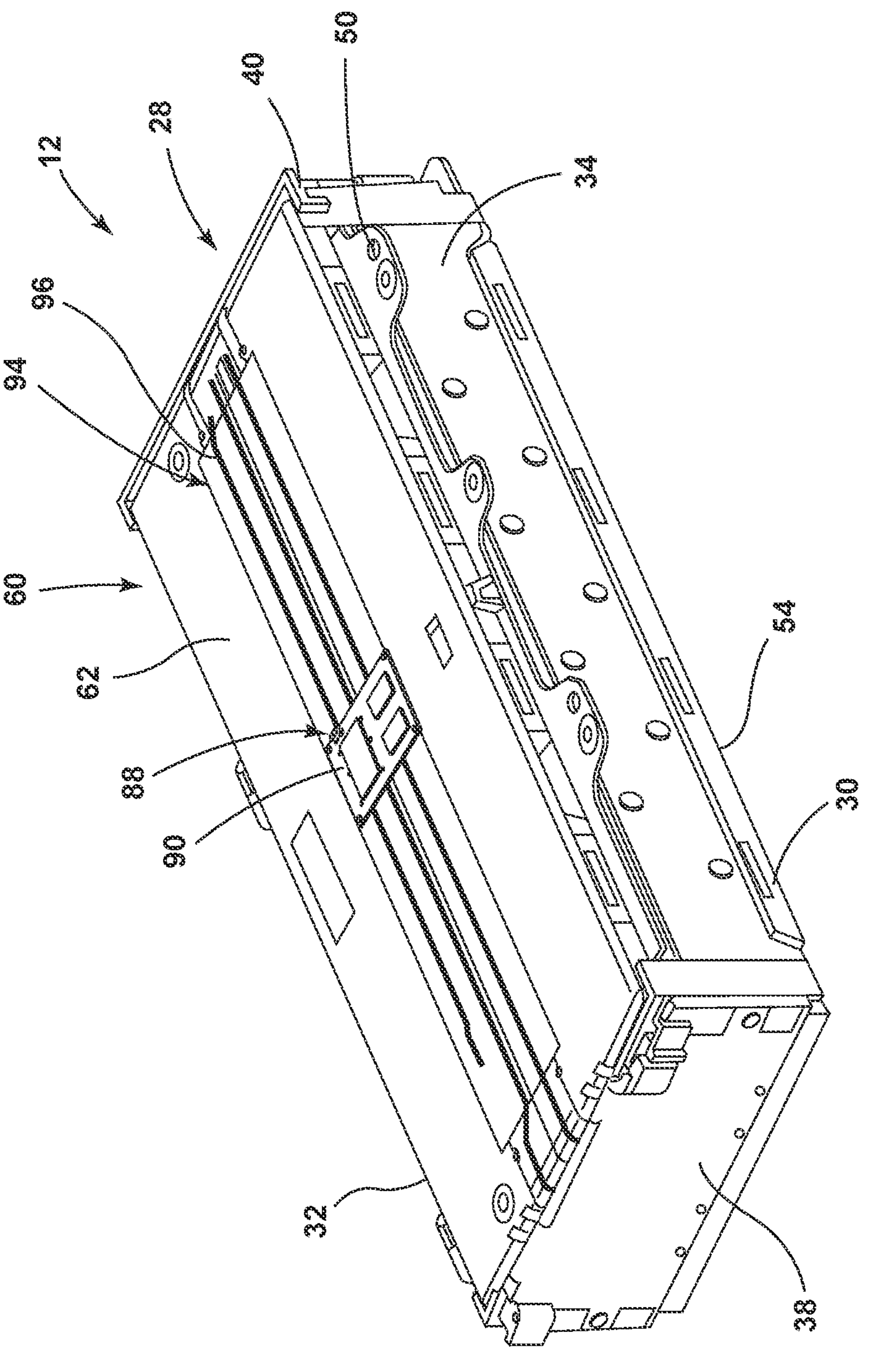
FIG. 2 illustrates a perspective view of the battery module in accordance with one non-limiting aspect of the present disclosure.
Figure 3:
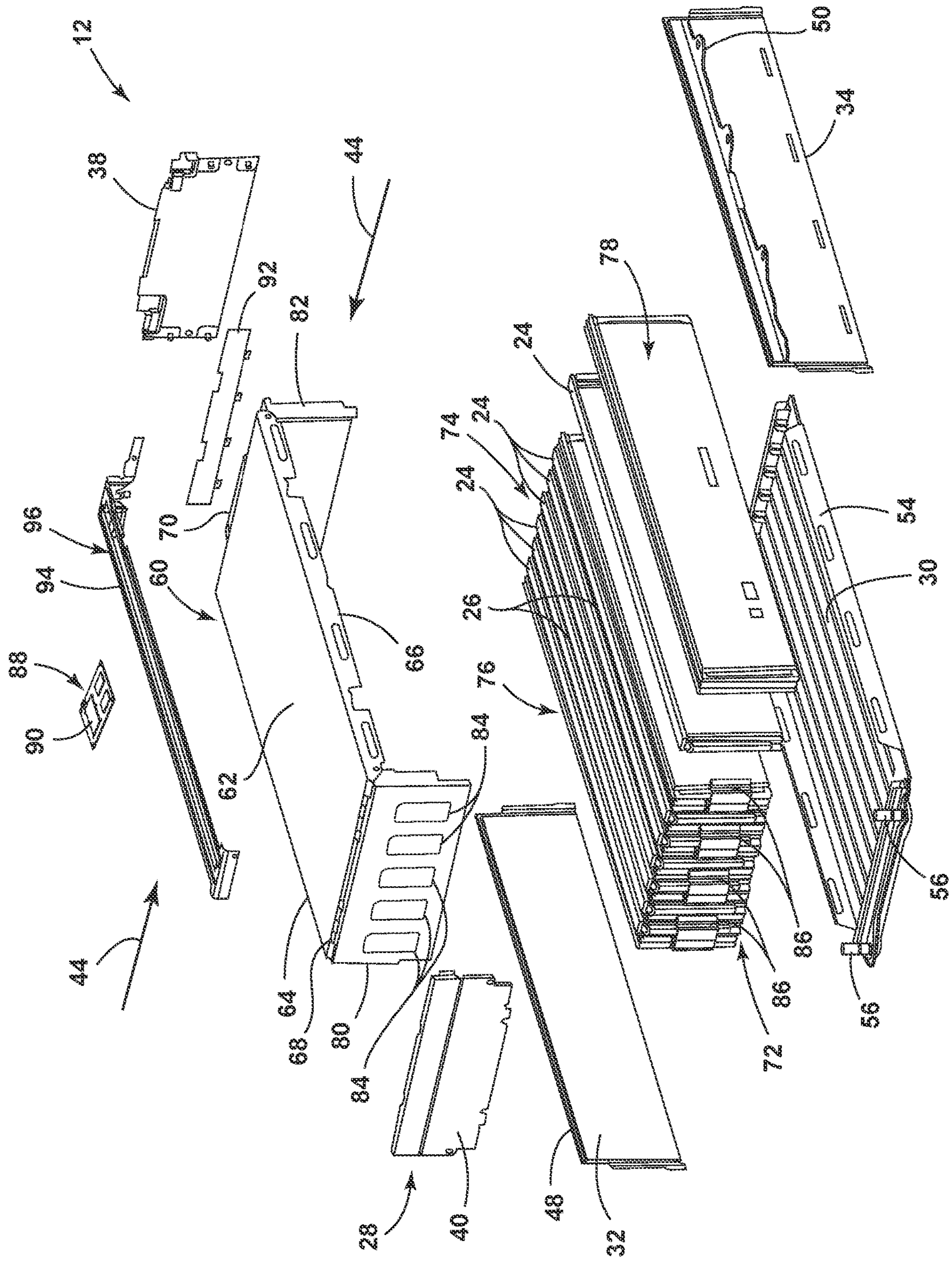
FIG. 3 illustrates an assembly view of the battery module in accordance with one non-limiting aspect of the present disclosure.

FIG. 2 illustrates a perspective view of the battery module 12 in accordance with one non-limiting aspect of the present disclosure. As shown with greater detail in an assembly view presented in FIG. 3, the battery module 12 may include a plurality of battery cells 24 configured for storing and supplying the electrical power. The battery cells 24 may be pouch-type, Li-ion polymer battery cells 24 stacked in a side-by-side facing relation with one another and connected in parallel or series, with the vehicle 10 optionally including multiple battery modules 12 of a similar construction. While shown as a graphite-based, Li-ion "pouch cell" battery, the battery cells 24 may be adapted to other chemistries and other constructions and/or other types of electrical devices, including cylindrical and prismatic battery cell configurations.

Each battery cell 24 may be constructed with an outer battery casing, which is represented in the drawings by an envelope-like pouch, having an electrical terminal extending therefrom at each end. The casing may be formed of an aluminum sheet or foil, or other suitable material, both sides of which may be coated with a polymeric material that insulates the metal from the cell elements and from an adjacent cell(s). A plurality of thermal barriers and expansion-compensating foam 26 may be disposed between a portion of the battery cells 24 to divide and thermally insulate groups of the battery cells 24 from each other and allow for expansion and contraction of the cells 24 during operation.

The battery module 12 may be configured to store the battery cells 24 inside a protective, electrically insulating battery housing module 28. The housing module 28 may be a rigid, multi-part construction assembled from a flanged housing base 30 with a pair of elongated sidewalls 32, 34 and endwalls 38, 40 that project generally orthogonally from the base 30. Once properly arranged and mounted, the stacked battery cells 24 may be supported on the housing base 30 and sandwiched between the module sidewalls 32, 34. The sidewalls 32, 34 may be configured for providing a sideways pressure on the battery cells 24, which may be represented with the sideways arrows 44. The illustrated endwalls 38, 40 may optionally be configured for providing an endways pressure on the battery cells 24, however, the illustrated configuration contemplates such endways pressure being less of an influence. For ease of manufacture and assembly, the sidewalls 32, 34 may be substantially identical to each other, optionally formed from a rigid plastic material. Mounting brackets 48, 50 may extend transversely from the sidewalls 32, 34 to facilitate mounting within the vehicle 10. A cooling plate 54 may be mounted underneath the stacked battery cells 24 to selectively transfer heat out of the battery module 12. The cooling plate 54 may include one or more coolant channels 56 that pass therethrough a coolant fluid received via coolant ports.

The housing module 28 may include an integrated interconnect board (ICB) assembly 60 configured to align and electrically interconnect the battery cells 24. The ICB assembly 60 may be mounted on top of the base 30 to provide a protective C-shaped jacket that may be generally defined by a central cover 62 with a pair of sidewall flanges 64, 66 and a pair of endwall flanges 68, 70. The sidewall flanges 64, 66 and endwall flanges 68, 70 may respectively project generally orthogonally and downwardly from opposing sides and ends of the central cover 62. The central cover 62 may extend end-to-end between opposed ends 72, 74 of the battery cells 24 and side-to-side between opposed sides 76, 78 of the battery cells 24. The ICB assembly 60 may include endwall plates 80, 82 segmented into a series of elongated, mutually parallel endwall tabs that may be arranged side-by-side in a vertical column-like fashion. A plurality of electrical busbar connectors 84 may be attached to an outboard side of the endwall plates 80, 82 to electrically interconnecting the electrical terminals 86 of the battery cells 24 and to electrically interconnect the battery cells 24 with an electrical bus (not shown).

The battery module 12 may include a pressure measurement system 88 configured in accordance with one aspect of the present disclosure for measuring a pressure resulting from the battery cells 24 expanding and contracting while storing and supplying electrical power. The pressure measurement system 88 may include a strain gauge circuit 90 or other device configured to measure deformation of the battery module 12 and a cell monitoring unit (CMU) 92 or other computation module configured for generating a pressure measurement based on the amount of the deformation. The CMU 92 may be mounted between the endwall plates 80, 82 and one of the opposed endwalls 38, 40. The CMU 92 may cooperate with and electrically connect to a flexible printed circuit board (PCB) 94 mounted to the central cover 62. The strain gauge circuit 90 may be integrated into the flexible PCB 94, optionally in addition to one or more sensing devices (not shown) configured for sensing current, voltage, and/or temperature of the battery cells 24. The flexible PCB 94 may include a plurality of electrical traces 96, which are shown for exemplary purposes as extending end-to-end between the opposed endwall flanges 68, 70 for electrically connecting the strain gauge circuit 90 and the sensing devices to the battery cells 24 and/or the CMU 92.

The CMU 92 may be comprised of a printed circuit board, a flexible circuit board, and/or other componentry capable of calculating or otherwise determining the values and information contemplated herein. The CMU 92, for example, may be configured as an Application Specific Integrated Circuit 90 (ASIC) having capabilities commensurate with those described herein. The CMU 92 may include a computer readable storage medium having a plurality of non-transitory instructions stored thereon, which when executed with associated processor, may be sufficient to facilitate or otherwise enable the operations and processes described herein. The vehicle 10 may include a wide variety of systems and subsystems for a correspondingly wide variety of operational capabilities, which may be controlled or predicated based at least in part on a state of health (SOH), a state of charge (SOC), or other electrical capability of the battery cells 24 to store and supply electrical power. The CMU 92 may be configured to calculate and/or to provide data, values, etc. for an electronic control unit (ECU) in communication therewith to calculate the SOH, the SOC, and other representations of the electrical capability of the battery cells 24 based on the current, voltage, and/or temperature values generated with the sensing devices. One non-limiting aspect of the present disclosure contemplates improving or enhancing these calculations by additionally factoring in and accounting for the pressure measurement.

The pressure measurement generated by the CMU 92 as a function of the deformation sensed with the strain gauge circuit 90 may be useful in fine-tuning or otherwise maximizing accuracy of calculations intended to represent electrical capabilities of the battery cells 24, i.e., the SOH, SOC, etc. The battery cells 24 may periodically expand and contract with charging and discharging of the battery module 12, e.g., the battery cells 24 may expand when storing electrical power and contract when supplying electrical power. The sidewalls 32, 34 may be configured to restrain the battery cells 24 in the side-by-side facing relation with an initial amount of sideways pressure 44. This initial amount of sideways pressure 44, may be configured to partially or initially compress the thermal barriers 26 or other material(s) included as part of or interspersed with the battery cells 24. This initial amount of sideways pressure 44 may be required for the battery cells 24 to properly perform the electrochemical operations associated with storing and supplying electrical power. The expansion and contraction during use may exceed the desired or initial amount of sideways pressure 44, which may degrade or otherwise influence an ability of the battery cells 24 to supply and store electrical power.

The influences resulting from the expansion and contraction may be relatively short lived in so far as the battery cells 24 expanding during driving of the vehicle 10 and thereafter contracting back to a nominal level such that the initial amount of sideways pressure 44 may be exceeded for a limited period of time coinciding with operation of the vehicle 10.

The repeated cycles of storing and supplying of the electrical power, however, may result in the battery cells 24 irreversibly expanding. The irreversible expansion may occur on an incremental basis as result of the battery cells 24 expanding a certain amount and failing to contract by an equal amount. The irreversible expansion may result in the battery cells 24 causing a corresponding increase in the sideways pressure 44 when inactive or resting such that the subsequent expansion and contraction when active or in use may exacerbate the pressure fluctuations influencing the capabilities of the battery cells 24 to store and supply the electrical power. In the absence of accounting for this expansion, or more specifically the sideways pressure 44 changes, the calculations of the SOH, SOC, etc. based solely on current, voltage, temperature, resistance, etc. may be less accurate than if the calculations accounted for the expansion.

One non-limiting aspect of the present disclosure contemplates accounting for the influence of pressure on the performance of the battery cells 24 by factoring in the pressure measurement when performing calculations like SOH, SOC, etc. The CMU 92 may be configured to generate the pressure measurement as a function of the deformation sensed with the strain gauge circuit 90, which for non-limiting purposes is predominately described with respect to sensing deformation of the central cover 62. The deformation, i.e., expansion and contractions, of the central cover 62 may be commensurate with or proportional with the expansion and contraction of the battery cells 24 such that a relationship therebetween may be used to account for pressure fluctuations when determining SOH, SOC, etc. The pressure measurement derived from the deformation sensed with the strain gauge circuit 90 may thereby provide a value beneficial in controlling or otherwise facilitating operation of the vehicle 10. The pressure measurement may also be beneficial in providing thermal runway protection as increases, rapid changes, or other variances in the pressure may result from heating of the battery cells 24 whereby the corresponding pressure measurements may be used to predict temperature increases useful in providing thermal runway protection.

Figure 4:
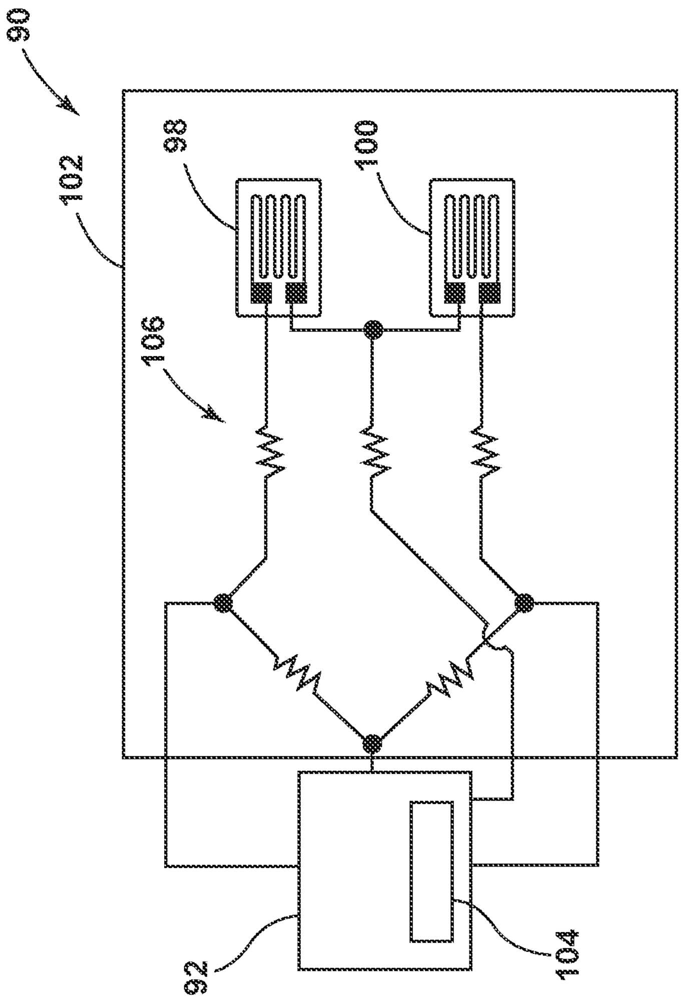
FIG. 4 illustrates a schematic of a strain gauge circuit in accordance with one non-aspect of the present disclosure.

FIG. 4 illustrates a schematic of the strain gauge circuit 90 in accordance with one non-aspect of the present disclosure. The strain gauge circuit 90 may be configured with an unstressed strain gauge 98 and a stressed strain gauge 100 mounted on a substrate 102 or other feature capable of being integrated with the flexible PCB, optionally with additional circuit components, such as resistors 106. The stressed strain gauge 100 may be configured for moving in response to deformation of the central cover 62. The unstressed strain gauge 98 may be configured to remain stationary in response to deformation of the central cover 62. The use of the two strain gauges 98, 100 may be advantageous in ameliorating the effects of temperature and/or other environmental conditions influencing sensing of the deformation. The deformation measured with the unstressed strain gauge 98, for example, may be a result from temperature or other environmental conditions such that that deformation may be subtracted from or otherwise accounted for in the deformation measured with the stressed strain gauge 100. One or more of the resistors 106 connecting the strain gauges 98, 100, to the bridge circuit may be wires or/or flex-circuit traces of approximately equal length rather than discrete resistor devices, optionally with one or more of the resistors 106 having an approximately equal resistance as the wires and/or flex-circuit traces 96 running from the processor 92 to the strain gauges 98, 100. One or more of the resistors 106 may be configured to be roughly equal in length and size to facilitate their resistance being roughly equal, which may be helpful in enhancing the accuracy of the strain gauge measurement.

The strain gauge circuit 90 may include a filter 104 configured for filtering out noise resulting from vibration of the vehicle 10 or other disruptions disassociated with expansion and contraction of the battery cells 24, e.g., the deformation induced by the battery cells 24 may be a minor rate and occur at a slow rate such that faster or larger deformations may be filtered out as noise resulting from vibration or other operation of the vehicle 10. The strain gauge circuit 90 is shown to be configured for sensing the deformation sideways relative to the battery cells 24, i.e., in a direction perpendicular to the sidewalls 32, 34. This sideways deformation may be more pronounced or more influential than endways deformation, i.e., deformation perpendicular to the endwalls 38, 40, due to the battery cells 24 being shaped in the illustrated manner. The present disclosure fully contemplates other configurations for the strain gauge circuit 90, including configurations sufficient for measuring the deformation in multiple directions, i.e., measuring sideways and anyways the information.

The strain gauge circuit 90 may be mounted to the central cover 62 in the described manner, however, the present disclosure fully contemplates the strain gauge circuit 90 being mounted to other portions of the battery module 12 and/or the use of multiple strain gauge circuits 90, such as to measure deformation at different portions of the central cover 62 or elsewhere on the battery module 12. The present disclosure also fully contemplates the strain gauge circuit 90 being mounted to other portions of the battery module 12, such as within or outside of the central cover 62, on top of one or more of the battery cells 24, within the thermal barriers, etc. The disclosure also fully contemplates the strain gauge circuit 90 having other configurations and capabilities, such as being constructed as a pressure pad or other device capable of measuring forces applied to a surface. The strain gauge circuit 90 is shown to be mounted to an outboard side of the central cover 62 as such an integration thereof may permit generating the pressure measurement without having to make changes to internal componentry and/or without having to account for internal environmental conditions of the battery module 12, which may in turn minimize complexity and costs.

Figure 5:
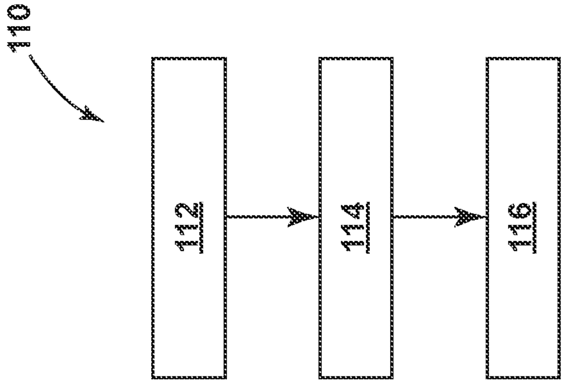
FIG. 5 illustrates a flowchart of a method for utilizing a pressure measurement system to enhance operations of a vehicle in accordance with one non-limiting aspect of the present disclosure.

FIG. 5 illustrates a flowchart 110 of a method for utilizing the pressure measurement system 88 to enhance operations of the vehicle 10 in accordance with one non-limiting aspect of the present disclosure. Block 112 relates to a sensing process for sensing a deformation of the battery module 12, such as by controlling the strain gauge circuit 90 to sense a deformation of the central cover 62. Block 114 relates to a pressure management process for generating a pressure measurement of the battery module 12, or more specifically for the battery cells 24, as a function of the sensed deformation. The pressure measurement, for example, may be configured to quantify an amount of sideways force applied by the battery cells 24 towards the sidewalls 32, 34. Block 116 relates to a calculation process for calculating SOH, SOC, thermal runway protection values, etc. based at least in part on the sensed deformation.

As supported above, the present disclosure contemplates a battery module with a plurality of battery cells inside it. The cells inside the battery module may have broad faces in contact with one another and/or the sides of the modules and/or additional interspersed module elements such as foam, thermal barriers, cooling plates, and insulation. The cells and these elements may be stacked next to one another creating a block of cells and other components. The battery module may include structural elements that clamp the block of cells and other components. The battery module structural elements may be in tension by virtue of putting the block of cells and other components into compression. The battery cells may expand and contract slightly during charging and discharging, and over their lifetime, which applies outward pressure on the structural elements of the module. The battery cells may expand more when they go into thermal runaway, thereby applying outward pressure on the structural elements of the module. The varying outward pressure on the structural elements of the module may result in varying tension in the same elements. This varying pressure/tension may be measured via a strain gauge on one of the members in tension. The strain gauge may be incorporated into an existing flexible circuit that is already present in the battery module designs and adjacent to the structural elements that are in tension. The resistance of the strain gauge may be configured to change based on the strain that it experiences. This may be measured by applying a small current across the strain gauge and measuring the change in voltage, or by applying a constant voltage and measuring the change in current. The resulting measurement (voltage or current) may be converted via an A/D converter into an estimate of strain referencing in-situ calibrated values or calibrated values based on the design. The estimated strain signal may be converted into an estimated pressure of the cells inside the module by developing a transfer function based on the mechanical properties of the module (i.e. cross section of the members in tension, and surface area of the cells under compression). The estimated pressure signal may be used raw or filtered and may be used by itself or in combination with other sensor signals to detect thermal runaway using absolute values or rate-of-change. The estimated pressure signal may be used raw or filtered and may be used by itself or in combination with other sensor signals to estimate the battery State-of-Charge (SOC) and/or State-of-Health (SOH) using absolute values or rate-of-change.

The terms "comprising", "including", and "having" are inclusive and therefore specify the presence of stated features, steps, operations, elements, or components, but do not preclude the presence or addition of one or more other features, steps, operations, elements, or components. Orders of steps, processes, and operations may be altered when possible, and additional or alternative steps may be employed. As used in this specification, the term "or" includes any one and all combinations of the associated listed items. The term "any of" is understood to include any possible combination of referenced items, including "any one of" the referenced items. "A", "an", "the", "at least one", and "one or more" are used interchangeably to indicate that at least one of the items is present. A plurality of such items may be present unless the context clearly indicates otherwise. All numerical values of parameters (e.g., of quantities or conditions), unless otherwise indicated expressly or clearly in view of the context, including the appended claims, are to be understood as being modified in all instances by the term "about" whether or not "about" actually appears before the numerical value. A component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function.

While various embodiments have been described, the description is intended to be exemplary, rather than limiting and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims. Although several modes for carrying out the many aspects of the present teachings have been described in detail, those familiar with the art to which these teachings relate will recognize various alternative aspects for practicing the present teachings that are within the scope of the appended claims. It is intended that all matter contained in the above description or shown in the accompanying drawings shall be interpreted as illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

What is claimed is:

1. A battery module with integrated pressure measurement, comprising:

a plurality of battery cells stacked in a side-by-side facing relation, the battery cells configured for storing and supplying electrical power such that the battery cells periodically expand and contract sideways when storing and supplying the electrical power;

a housing module including a base and opposed sidewalls configured for restraining the battery cells in the side-by-side facing relation, the base configured for supporting the battery cells and the opposed sidewalls configured for providing a sideways pressure on the battery cells;

an integrated interconnect board (ICB) assembly configured for electrically interconnecting the battery cells, the ICB assembly including a central cover extending end-to-end between opposed ends of the battery cells, the central cover configured for expanding and contracting sideways with the battery cells;

a strain gauge circuit configured for measuring a sideways deformation of the central cover resulting from the central cover expanding and contracting sideways with the battery cells; and a cell monitoring unit (CMU) configured for generating a pressure measurement of the sideways pressure based on the sideways deformation.

2. The battery module according to claim 1, wherein:

the strain gauge circuit is configured for integrating with a flexible printed circuit board (PCB) mounted to the central cover.

3. The battery module according to claim 2, wherein:

the flexible PCB includes one or more sensing devices configured for sensing current, voltage, and/or temperature of the battery cells.

4. The battery module according to claim 3, wherein:

the housing module includes opposed endwalls configured for restraining the opposed ends of the battery cells;

the ICB assembly includes opposed endwall plates extending from the central cover, the opposed endwall plates having busbars configured for electrically interconnecting the battery cells; and the CMU is configured for mounting between one of the opposed endwall plates and one of the opposed endwalls.

5. The battery module according to claim 4, wherein:

the flexible PCB includes a plurality of electrical traces extending end-to-end across the central cover for electrically connecting the sensing devices to the battery cells.

6. The battery module according to claim 5, wherein:

the flexible PCB is mounted to an outboard side of the central cover.

7. The battery module according to claim 6, wherein:

the central cover is comprised of an electrically isolating material and an inboard side of the central cover faces the battery cells.

8. The battery module according to claim 7, wherein:

the CMU is configured to calculate a state of charge (SOC) and/or a state of health (SOH) of the battery cells based at least in part on the pressure measurement.

9. The battery module according to claim 2, wherein:

the strain gauge circuit includes a stressed strain gauge and an unstressed strain gauge, the stressed strain gauge configured for moving in response to the sideway deformation, the unstressed strain gauge configured for remaining stationary in response to the sideway deformation.

10. The battery module according to claim 1, wherein:

the battery cells are configured for supplying electrical power to an electric motor configured to drive an electric vehicle;

the battery cells are configured for storing electrical power received from an onboard battery charging module (OBCM) of the electric vehicle; and the strain gauge circuit includes a filter configured to filter out noise resulting from vibration of the electric vehicle.

11. The battery module according to claim 8, wherein:

the central cover includes opposed sidewall flanges configured for extending from the central cover between the battery cells and the opposed sidewalls, the opposed sidewall flanges compressing against the battery cells with the sideways pressure.

12. A battery module with integrated pressure measurement, comprising:

a plurality of battery cells configured for storing and supplying electrical power, the battery cells periodically expanding and contracting when storing and supplying the electrical power;

a housing module configured for providing a restraining pressure on the battery cells;

an integrated interconnect board (ICB) assembly configured for electrically interconnecting the battery cells, the ICB assembly including a central cover covering the battery cells, the central cover configured for expanding and contracting with the battery cells;

a strain gauge circuit configured for sensing a deformation of the central cover resulting from the central cover expanding and contracting with the battery cells; and a cell monitoring unit (CMU) configured for generating a pressure measurement of the restraining pressure based on the deformation.

13. The battery module according to claim 12, wherein:

the strain gauge circuit is configured to sense the deformation from side-to-side across the central cover.

14. The battery module according to claim 12, wherein:

the strain gauge circuit is configured to sense the deformation from end-to-end across the central cover.

15. The battery module according to claim 12, wherein:

the strain gauge circuit is configured to sense the deformation from end-to-end and side-to-side across the central cover.

16. The battery module according to claim 12, wherein:

the strain gauge circuit is configured for integrating with a flexible printed circuit board (PCB) mounted to the central cover.

17. The battery module according to claim 16, wherein:

the battery cells are stacked side-to-side;

the housing module includes opposed sidewalls and opposed endwalls configured for restraining the battery cells;

the ICB assembly includes opposed sidewall flanges and opposed endwall flanges extending toward the battery cells relative to the central cover, the ICB assembly including opposed endwall plates extending from the opposed endwall flanges, the opposed endwall plates having busbars configured for electrically interconnecting the battery cells;

the CMU is configured for mounting between one of the opposed endwall plates and one of the opposed endwalls;

the battery cells are configured for storing and supplying electrical power for an electric vehicle; and the strain gauge circuit includes a filter configured to filter out noise resulting from vibration of the electric vehicle.

18. The battery module according to claim 17, wherein:

the flexible PCB includes one or more sensing devices configured for sensing current, voltage, and/or temperature of the battery cells and a plurality of electrical traces extending end-to-end between the opposed endwall flanges for electrically connecting the sensing devices to the battery cells.

19. The battery module according to claim 16, wherein: the flexible PCB includes one or more sensing devices configured for sensing current, voltage, and/or temperature of the battery cells.

20. The battery module according to claim 16, wherein:

the housing module includes opposed endwalls configured for restraining the opposed ends of the battery cells; the ICB assembly includes opposed endwall plates extending from the central cover, the opposed endwall plates having busbars configured for electrically interconnecting the battery cells; and the CMU is configured for mounting between one of the opposed endwall plates and one of the opposed endwalls.

* * * * *